United States Patent
Stangl et al.

(10) Patent No.: US 8,884,154 B2
(45) Date of Patent: Nov. 11, 2014

(54) THIN-FILM SOLAR MODULE CONTACTED ON ONE SIDE AND HAVING AN INNER CONTACT LAYER

(75) Inventors: Rolf Stangl, Berlin (DE); Klaus Lips, Berlin (DE); Bernd Rech, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 961 days.

(21) Appl. No.: 13/055,969

(22) PCT Filed: Jul. 11, 2009

(86) PCT No.: PCT/DE2009/000966
§ 371 (c)(1),
(2), (4) Date: Jan. 26, 2011

(87) PCT Pub. No.: WO2010/012259
PCT Pub. Date: Feb. 4, 2010

(65) Prior Publication Data
US 2011/0126886 A1    Jun. 2, 2011

(30) Foreign Application Priority Data

Jul. 30, 2008  (DE) .......................... 10 2008 035 327
Dec. 1, 2008   (DE) .......................... 10 2008 060 404

(51) Int. Cl.
| | | |
|---|---|---|
| *H02N 6/00* | (2006.01) | |
| *H01L 31/042* | (2014.01) | |
| *H01L 31/00* | (2006.01) | |
| *H01L 21/00* | (2006.01) | |
| *H01L 27/142* | (2014.01) | |
| *H01L 31/0224* | (2006.01) | |

(52) U.S. Cl.
CPC .... *H01L 27/1423* (2013.01); *H01L 31/022433* (2013.01); *Y02E 10/50* (2013.01); *H01L 31/022425* (2013.01)
USPC .............. 136/244; 136/249; 136/256; 438/98

(58) Field of Classification Search
CPC ............ H01L 27/1422; H01L 27/1423; H01L 27/1425; H01L 27/1426; H01L 27/1427; H01L 31/022425

USPC ......................................................... 136/244
See application file for complete search history.

(56) References Cited

U.S. PATENT DOCUMENTS 6,399,873 B1 * 6/2002 Sano et al. ..................... 136/249
6,559,479 B1   5/2003 Luedemann
(Continued)

FOREIGN PATENT DOCUMENTS

DE        198 54 269 A1    6/2000
DE    11 2005 002595 T5    9/2007
(Continued)

OTHER PUBLICATIONS

International Search Report from corresponding PCT Application No. PCT/DE2009/000966 dated Jul. 13, 2010.

(Continued)

*Primary Examiner* — Eli Mekhlin
(74) *Attorney, Agent, or Firm* — Leydig, Voit & Mayer, Ltd.

(57) ABSTRACT

A thin-film solar module contacted on one side includes a support layer, a photoactive absorber layer and at least one dopant layer deposited over a surface area of at least one side of the absorber layer so as to form a thin-film packet that is divided into thin-film solar cell areas by insulating separating trenches. The thin-film solar module includes first and second contact systems. The first contact system includes contacts connected by an outer contact layer. The second contact system consists of an inner contact layer covering a side of the solar cell areas that face away from the support layer so as to separately discharge excess charge carriers generated by incident light in the absorber layer. The second contact system includes structures that surround and electrically insulate the contacts, which extend through the inner contact layer from the outer contact layer. The first and second contact systems are electrically conductive and connected in series by series contacts in interconnection areas and electrically insulated from each other by an insulation layer outside of the interconnection areas.

20 Claims, 9 Drawing Sheets

(56) References Cited

U.S. PATENT DOCUMENTS

| | | |
|---|---|---|
| 7,136,209 B2 | 11/2006 | Lerner et al. |
| 2004/0261834 A1* | 12/2004 | Basore et al. ............... 136/244 |
| 2006/0130891 A1 | 6/2006 | Carlson |
| 2006/0213547 A1* | 9/2006 | Tanaka et al. ............... 136/244 |
| 2008/0146365 A1* | 6/2008 | Miesak ......................... 473/221 |
| 2008/0156365 A1* | 7/2008 | Scholz et al. ................. 136/251 |
| 2009/0266401 A1* | 10/2009 | Stangl et al. ................. 136/244 |

FOREIGN PATENT DOCUMENTS

| | | |
|---|---|---|
| DE | 112005002592 T2 | 9/2007 |
| WO | 97/21253 A1 | 6/1997 |
| WO | 03/019674 A1 | 3/2003 |
| WO | WO 2007140763 A2 * | 12/2007 |

OTHER PUBLICATIONS

Basore "Simplified Processing and Improved Efficiency of Crystalline Silicon on Glass Modules", Proc. EPVSEC-19, Paris, France, Jun. 2004).

Stangl et al. "Planar Rear Emitter Back Contact Amorphous/Crystalline Silicon Heterojunction Solar Cells (RECASH/PRECASH)" (Paper IEEE-PVSEC-33. Conf. San Diego, California, United States, May 12 to 16, 2008; submitted on May 8, 2008).

* cited by examiner

THIN-FILM SOLAR MODULE CONTACTED ON ONE SIDE AND HAVING AN INNER CONTACT LAYER

CROSS-REFERENCE TO PRIOR APPLICATIONS

This application is a U.S. National Phase application under 35 U.S.C. §371 of International Application No. PCT/DE2009/000966, filed on Jul. 11, 2009, and claims benefit to German Patent Application Nos. DE 10 2008 035 327.2, filed on Jul. 30, 2008, and DE 10 2008 060 404.6, filed on Dec. 1, 2008. The International Application was published in German on Feb. 4, 2010 as WO 2010/012259 under PCT Article 21(2).

FIELD

The invention relates to a thin-film solar module contacted on one side and having a support layer, a photoactive absorber layer and at least one dopant layer deposited over the entire surface area on one side of the absorber layer, as well as additional functional layers, whereby the thin-film packet thus formed is divided into solar cell areas by insulating separating trenches.

BACKGROUND

Solar modules produced with thin-film technology are based on semiconductors that are applied preferably over a large surface area of usually inexpensive support layers such as glass, metal foil or plastic films. The various technological variants have not yet been developed to the stage of serial production as is the case with silicon-wafer technology, but over the medium-range, they entail a greater cost-reduction potential. Expensive semiconductor material is saved here in comparison to conventional wafer technology. This is particularly important in the case of crystalline silicon since the production capacities for silicon are currently not sufficient to meet the demand. Moreover, with thin-film solar modules, there is no need to assemble individual solar cells. The thin-film packets deposited over a large surface area are divided into smaller areas (usually into parallel, strip-like solar cell areas) and subsequently connected in series so as to be integrated. In this manner, support layers measuring up to one square meter can be coated, which significantly reduces the handling work at the factory. The challenge with thin-film solar modules lies in achieving sufficient levels of efficiency through adequate light absorption in the functional layers.

The solar cell areas of the thin-film solar modules convert light into electric energy. Normally, the modules are made of direct or indirect semiconductor materials that, through doping, contain layer or areas having different conductivity for positive (p, holes, p-type) and negative (n, electrons, n-type) charge carriers. These layers will be referred to below as dopant layers for collecting the charge carriers. Positive and negative excess charge carriers generated by incident light are created mainly in the absorber layer, the latter being undoped (intrinsic, i) or only weakly doped in the case of a pin configuration, and being in contact on both sides with dopant layers that are highly n-type conductive as well as highly p-type conductive. If the absorber layer is doped, the at least one layer that is highly counter-doped is referred to as the emitter layer, and a p-n configuration is present. Optionally, the absorber layer and the emitter layer can also be in contact with functional layers that are highly doped with the same type. Field-passivation layers are formed that serve to back-scatter uncollected charge carriers on the front or back (BSF or FSF layers or areas). The excess charge carriers are separated either at the p-n junction between the emitter layer and the absorber layer (p-n configuration employing a doped absorber layer), or they are separated by the electric field in the intrinsic or weakly doped absorber layer, said electric field being encompassed by the n-type and p-type dopant layers arranged on both sides of the absorber layer (pin configuration employing an intrinsic absorber layer), and they can be collected by contact systems that are electrically conductively connected to the associated areas or layers and can then be dissipated. The pin configuration can be seen as a limit case of the p-n configuration having a specific doping profile. However, the only excess charge carriers that contribute to the useful electric output of thin-film solar modules are those that actually reach the contact systems and do not recombine before that.

In contrast to conventional mono-crystalline or multi-crystalline solar cells made of silicon wafers, thin-film solar cells having an ultra-thin absorber layer are thinner by a factor of 100. Different industrial production methods ranging from vapor deposition of the support material in a high vacuum to sputtering methods are available for the various solar cell materials. It is expected that thin-film solar cells will account for considerable price reductions over the long run. Material savings, research into new semiconductor materials, low-temperature processes that are substantially more energy-efficient, simple module production through the structuring of full-surface solar cell areas and a high degree of automation all translate into lower production costs. Aside from the thin-film solar cells made of amorphous silicon (a-Si:H) or chalcogenide compound semiconductors (CI(G)S(e), CdTe), especially the thin-film solar cells consisting of micro-crystalline or poly-crystalline silicon ($\mu$c-Si, poly-c-Si wherein c-Si stands for both kinds) will be very attractive over the long run since they have the potential to attain high levels of efficiency, they are environmentally safe and the starting material is available in sufficient quantities. A particularly promising development is also the combination of micro-crystalline or poly-crystalline silicon as the absorber and amorphous silicon as the emitter, since, due to the hydrogen contained in it, its band gap is greater than that of crystalline silicon (c-Si/a-Si:H), and a-Si:H can passivate the absorber boundary surface very well.

International patent application no. WO 03/019674 A1 describes a thin-layer solar module having a back configuration of both contact systems (see FIGS. 1A, 1B pertaining to the state of the art, referred to below as "double-point concept"; see also Publication I by P. A. Basore: "Simplified Processing and Improved Efficiency of Crystalline Silicon on Glass Modules", Proc. EPVSEC-19, Paris, France, June 2004). In this double-point concept, both back contact systems are configured with punctiform contacts having different structuring. Thus, in order to achieve an efficient collection of the excess charge carriers, structural sizes are needed that are substantially smaller than the effective diffusion length of the absorber layer. Consequently, very small structural sizes are necessary in the case of a worse absorber quality. At the present time, such structural sizes can only be achieved—if at all—with very complex technology, for example, by means of photolithography. Consequently, in order to configure the effective diffusion length as large as possible, the prior-art double-point concept also makes use of re-crystallized silicon for the absorber layer, since such silicon displays a relatively large effective diffusion length for thin-film solar modules. Therefore, only absorbers that exhibit large diffusion lengths can be employed in the prior-art double-point concept.

Exclusively in the field of wafer-based (thick-film) solar cell technology, European patent no. DE 11 2005 002 592 T2 describes, for an absorber wafer, back contact with a first contact system having punctiform contacts and an outer contact layer and with a second contact system having exclusively a full-surface, inner contact layer for a p-n configuration with an emitter layer arranged on the back. Both contact systems are on top of each other on the side of the absorber wafer facing the emitter, and they are electrically insulated from each other by means of an insulating layer. The absorber wafer is contacted punctiformly by the first contact system, while the emitter layer is contacted over the entire surface. The practical implementation of this concept exclusively for wafer-based (thick-film) solar cells is described in Publication II by R. Stangl et al. titled "Planar Rear Emitter Back Contact Amorphous/Crystalline Silicon Heterojunction Solar Cells (RECASH/PRECASH)" (Paper IEEE-PVSEC-33. Conf. San Diego, Calif., United States, May 12 to 16, 2008, submitted on May 8, 2008). Both of these publications, however, do not contain any information about a possible module interconnection. Fundamentally, however, the contacting and module interconnection concepts found in wafer technology cannot be readily transferred to thin-film technology since the electronic conditions in the absorber layer and thus the boundary conditions and requirements for the contact systems that collect the charge carriers are fundamentally different. This is also the reason why inexpensive and efficient contacting systems for thin-film solar modules have not yet become commercially available.

SUMMARY

In an embodiment, the present invention provides a thin-film solar module contacted on one side and including a support layer, a photoactive absorber layer and at least one dopant layer deposited over a surface area of at least one side of the absorber layer so as to form a thin-film packet that is divided into thin-film solar cell areas by insulating separating trenches. The thin-film solar module includes first and second contact systems. The first contact system includes contacts connected by an outer contact layer. The second contact system consists of an inner contact layer covering a side of the solar cell areas that face away from the support layer so as to separately discharge excess charge carriers generated by incident light in the absorber layer. The second contact system includes structures that surround and electrically insulate the contacts, the contacts extending through the inner contact layer from the outer contact layer. The first and second contact systems are electrically conductive and connected in series by series contacts in interconnection areas and electrically insulated from each other by an insulation layer outside of the interconnection areas.

BRIEF DESCRIPTION OF THE DRAWINGS

The present invention will be explained in greater detail below with reference to exemplary embodiments shown in the schematic, not true-to-scale figures (for the sake of clarity, the layers are not true to scale with respect to each other), depicting cross sections and plan views of thin-film solar modules. The invention is not limited to the exemplary embodiments. Other features and advantages of various embodiments of the present invention will become apparent by reading the following detailed description with reference to the attached drawings which illustrate the following.

DETAILED DESCRIPTION

Figure 1A:
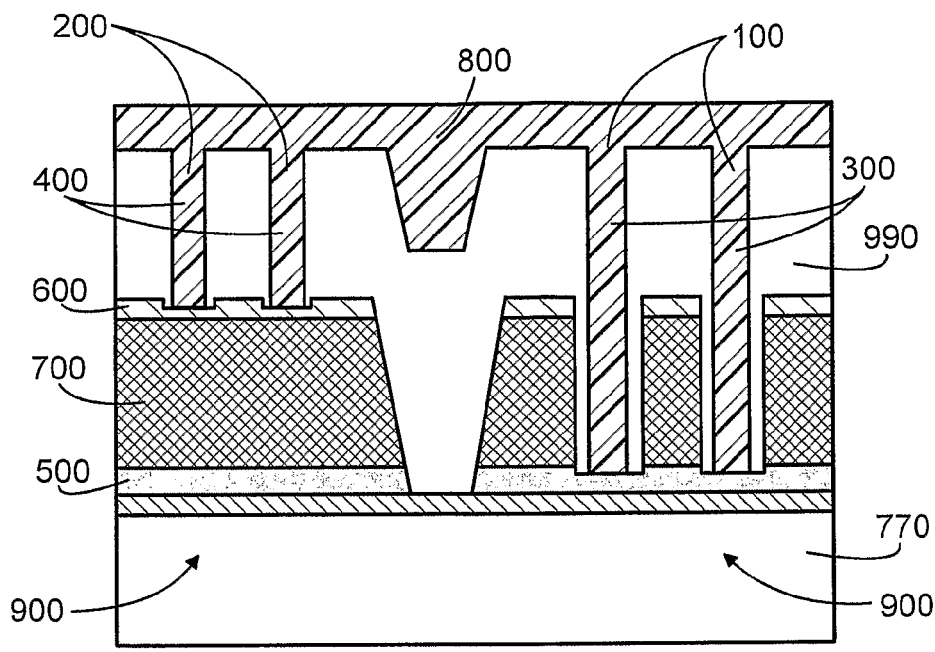
FIG. 1A shows a double-point interconnection concept of the prior art for the back series interconnection of thin-film solar modules in a cross sectional view.
Figure 1B:
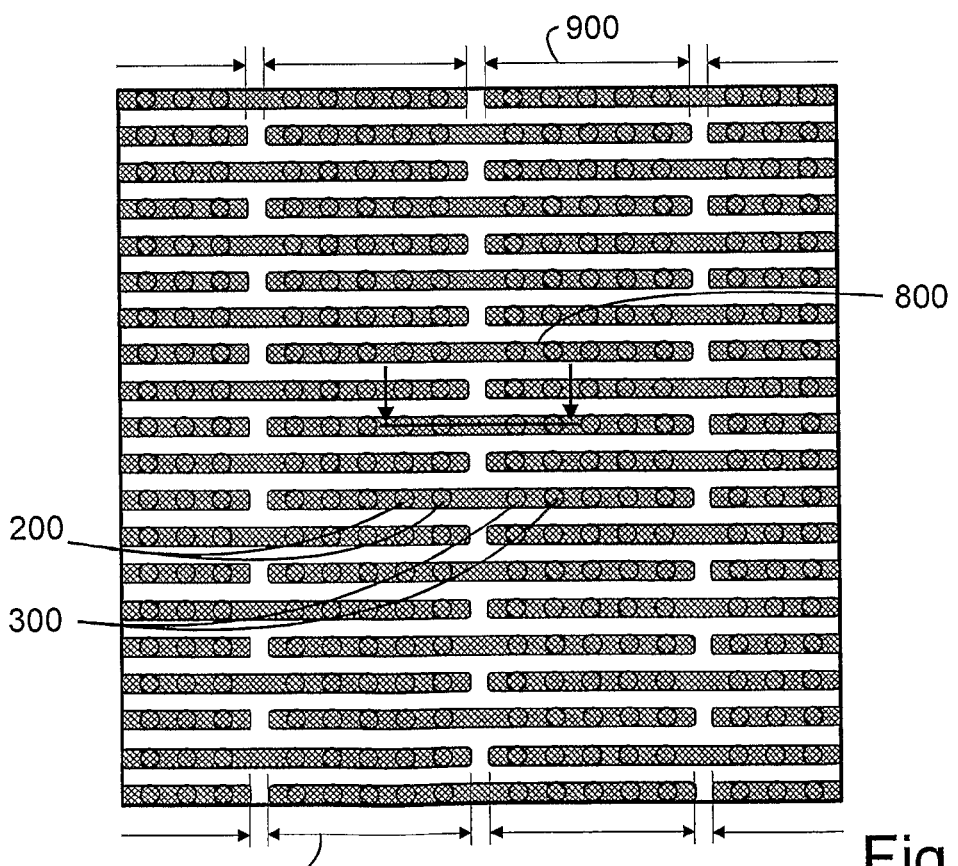
FIG. 1B shows a double-point interconnection concept for the back series interconnection of thin-film solar modules according to FIG. 1A, in a plan view.

Commercially available thin-film solar modules have a series interconnection on both sides, whereby a full-surface contact of the back of the solar cell is connected to a full-surface contact of the front of the solar cell. This calls for contacting of the individual solar cell areas on both sides. It has been discovered that this, however, results in a relatively large, efficiency-reducing dead zone in the finished solar module. Due to the full-surface contacting on both sides, it is not possible to employ concepts that raise the level of efficiency such as, for example, the introduction of punctiform contacting or exclusively back contacting, while avoiding absorption losses through the front contact system.

In contrast to this, in thin-film solar modules having a one-sided series interconnection, both contact systems for separately collecting the charge carriers are located on the same side of the absorber layer. This fundamentally has the advantage that only one side needs to be processed for the contacting. As set forth in the present invention, the term "front contact" is used when both contact systems are located on the side of the solar module ("front") exposed to incident light when the solar module is in operation. The term "back contact", in contrast, is employed when both contact systems are located on the side of the solar module ("back") that is not exposed to incident light when the solar module is in operation. The important aspect in the arrangement of the contact systems is primarily their efficiency in collecting charge carriers. In the case of a p-n configuration, it holds true that if the absorber is of sufficiently good electronic quality, that is to say, if the effective bulk diffusion length of the minority charge carriers is considerably greater than the layer thickness of the absorber layer, then the emitter layer should advantageously be located on the back of the thin-film solar module ("back contact"). This especially entails the advantage that, first of all, no shading losses or absorption losses occur through a front contact system, thus improving the efficiency, and secondly, the entire surface area of the side of the thin-film solar module that is exposed to incident light during operation of the solar module can be covered with additional functional layers. These functional layers can be, for instance, antireflection or surface-passivation layers as well as a front field-passivation layer (FSF—front surface field) for backscattering charge carriers that have migrated. However, if the absorber layer is of relatively poor electronic quality, that is to say, if the effective bulk diffusion length of the minority charge carriers is in about an equal or smaller order of magnitude than the layer thickness of the absorber layer, then the emitter layer should advantageously be located on the front of the module ("front contact"). All of the minority charge carriers of the absorber layer that are generated at a depth that is less than the effective bulk diffusion length of the absorber layer can then be reliably collected. In order to achieve efficiency-improving charge backscattering, a back field-passivation layer (BSF—back surface field) can be provided in the case of front contact (and analogously, a front field-passivation layer (FSF—front surface field) can be provided in case of back contact). A front contact, however, entails unavoidable and detrimental absorption losses or shading losses through the front contact systems. Analogous considerations apply in the case of a pin configuration.

Up until now, however, thin-film solar modules contacted on one side have not been effectively developed, which especially has to do with the greater structuring work needed for one-sided contacting and with a series interconnection that is compatible with such structuring in the thin-film solar module. The only known and industrially implemented (back) contacted thin-film solar module makes use of a specially developed series interconnection ("double-point concept").

In the known double-point concept, the differently configured punctiform contacts of both contact systems are connected in series to each other. This requires contacting the strip-like solar cell areas exclusively via punctiform contacts. This, however, increases the structuring work since two different punctiform contacts have to be implemented. Moreover, the prior-art double-point concept also faces problems in the orientation of the finished thin-film solar modules during the production process for the series interconnection. The problem of aligning small structures on large surface areas, which is technically extremely difficult to solve, is encountered since the different punctiform contacts have to be oriented very precisely with respect to each other on large surfaces so that they can be electrically connected to each other.

An aspect of the present invention is to put forward a thin-film solar module contacted on one side of the above-mentioned generic type, which does not entail any alignment problems with the series module interconnection and whose requisite structuring measures are fundamentally technically manageable and have been reduced to a minimum. Moreover, it should also be possible to technically realize p-n configurations and pin configurations having extremely small structural sizes. This can apply to homogenous as well as heterogeneous material systems and for front contacting as well as for back contacting for superstrate and substrate structures.

In an embodiment, the present invention provides a thin-film solar module contacted on one side and having a support layer, a photoactive absorber layer and at least one dopant layer deposited over the entire surface area on one side of the absorber layer, as well as additional functional layers, whereby the thin-film packet thus formed is divided into solar cell areas by insulating separating trenches, and having a first contact system with contacts and a contact layer that connects them, and having a second contact system with a contact layer on the side of the absorber layer facing away from the support layer for purposes of separately discharging excess charge carriers (p, n) generated in the absorber layer by incident light, whereby both contact systems are connected in series within interconnection areas and are electrically insulated from each other outside of the interconnection areas. In an embodiment, the present invention also provides a method for the production of such a thin-film solar module.

In the thin-film solar module according to an embodiment of the present invention, the second contact system consists exclusively of an inner contact layer that fully covers the entire surface area of the side of the thin-film solar cell areas that face away from the support layer, and it only has structures (in the sense of cutouts such as holes, slits, etc.) for the contacts of the first contact system. There are no contacts that protrude from the inner contact surface and that serve to reach functional layers located deeper, and that, in turn, would call for structures in the functional layers located in between. As a consequence, the structuring steps that would have to be provided for this purpose can be completely dispensed with in an embodiment of the invention. The contact layer of the first contact system is configured as an outer contact layer and it covers the entire thin-film packet and encompasses all of the contacts. These contacts extend through the structures in the inner contact layer so as to be electrically insulated. The inner contact layer and the outer contact layer are arranged on top of each other. Outside of the interconnection areas, the two contact layers are electrically insulated from each other by the interposition of an insulation layer. Inside the interconnection areas, the two contact layers are connected to each other by means of series contacts so as to be electrically conductive.

Therefore, the thin-film solar module according to an embodiment of the invention is the first to technically, consistently implement contacting on one side with a punctiform first contact system and a full-surface second contact system for a thin-film system. The elimination of a second punctiform contact system considerably reduces the structuring work in comparison to the prior-art double-point concept. The invention only calls for one structuring step. The inner contact layer of the second contact system is structured in order to form the contacts of the first contact system. Alignment problems do not occur with the module interconnection since now the punctiform contacts are connected to a full-surface contact layer.

For purposes of implementing the invention, according to an embodiment, the second contact system has exclusively one inner contact layer that is arranged between the absorber layer and the outer contact layer of the first contact system and—as a function of the structure of the thin-film packet—can serve to contact the absorber layer itself, but also any other functional layer that carries charge carriers. Moreover, the two contact systems are electrically insulated with respect to each other by means of an insulating layer that covers the entire surface area of the thin-film solar cell outside of the interconnection areas. Following the joint structuring of the inner contact layer of the second contact system together with the insulating layer as well as of the functional layers in the thin-film solar module, additional functional layers as well as the outer contact layer of the first contact system can then be applied without any additional structuring. Here, the series interconnection of the individual thin-film solar cell areas, which is preferably configured as strips in the module, has already been integrated into the structuring. Any kind of functional layer (emitter layer, BSF or FSF field-passivation layer, absorber layer, dopant layers with opposite doping and intrinsic layer) can be contacted with both contact systems by appropriately arranging the contact layers and executing the contact as well as by providing plated-through holes (extensions of the contacts through the absorber layer), depending on the type of support layer, on the arrangement of the functional layers, on the type of configuration (p-n or pin).

According to an embodiment, the present invention provides a thin-film solar module contacted on one side and comprising a one-sided series interconnection, in which the contacts of the first contact system are interconnected in series in an extremely simple manner to the contact layer of the second contact system between adjacent thin-film solar cell areas. For the module interconnection, only electric series contacts as well as linear or meandering insulating trenches are needed. A thin-film solar module contacted on one side and interconnected in such a simple manner entails considerably less structuring effort in comparison to all of the known one-sided module interconnections. Moreover, the problem of the alignment of small structures on large surfaces is overcome since there is no need to orient different types of point contacts with respect to each other. Moreover, the inefficient dead zone in the module is markedly reduced in comparison to the conventional interconnection of two-sided contact systems employed so far for almost all other thin-film solar modules. In the case of back contacting, the invention can completely avoid the absorption losses or shading losses through the front contact system, in other words, the one facing the incident light. Moreover, in terms of processing engineering, it becomes considerably easier to create plated-through holes through the absorber layer to the functional layers located underneath. If the contact systems are arranged on the front, then the contact surfaces should be configured so as to be transparent or grid-like and the contacts should be configured so as to minimize the surface area, especially so as to be punctiform or linear.

The series contacts are preferably configured to be linear in order to create a series interconnection of the thin-film solar cell areas. Here, the outer contact layer of the first contact system in the interconnection areas is structured by means of linear insulating trenches. As an alternative, the series contacts can also be configured to be punctiform, whereby the outer contact surface of the first contact system in the interconnection areas is then structured by means of meandering insulating trenches. Furthermore, the contacts of the first contact system and the structuring of the inner contact layer of the second contact system are preferably configured to be punctiform or linear.

In the case of the thin-film solar module according to an embodiment of the invention, a back contact can be formed when the carrier layer is configured as a superstrate, and the two contact systems are arranged on the side of the thin-film solar module facing away from the incident light, and a front contact can be formed when the carrier layer is configured as a substrate and both contact systems are arranged on the side of the thin-film solar module facing the incident light. A superstrate version with front contacting or a substrate version with back contacting calls for an arrangement of the contact systems between the absorber layer and the carrier layer. Even though these embodiments are technically feasible, they are not of great interest in actual practice. Furthermore, a p-n configuration can be implemented with a doped absorber layer and at least one counter-doped emitter layer as the dopant layer for separating the excess charge carriers generated in the absorber layer by the incident light. In this context, the absorber layer or an associated functional layer that carries charge carriers can be contacted via the contacts of the first contact system that penetrate through the layers above it so as to be insulated and that belong to the first contact system, and via the emitter layer or an associated functional layer that carries charge carriers with the inner contact layer of the second contact system. A reverse arrangement is equally possible. Furthermore, in the case of a p-n configuration, the emitter layer is either on the side of the thin-film solar module arranged facing or facing away from the incident light. On the other hand, in the case of the thin-film solar module according to an embodiment of the invention, a pin configuration can be especially advantageously implemented with an intrinsic or weakly doped absorber layer and at least two dopant layers with opposite doping on both sides of the absorber layer in order to separate the excess charge carriers generated in the absorber layer by the incident light. Then one of the two dopant layers or an associated functional layer that carries charge carriers can be contacted via the contacts of the first contact system that penetrate through the layers above so as to be insulated and that belong to the first contact system, and via the other dopant layer or an associated functional layer that carries charge carriers with the inner contact layer of the second contact system. Additional details regarding possible embodiments can be gleaned from the specific description part.

In other embodiments of the thin-film solar module according to the invention, it can also be advantageous to provide—as at least one additional functional layer—an antireflective layer, a seed layer, a surface-passivation layer, a field-passivation layer, a conductive layer and/or a buffer layer. Moreover, it is possible to implement homologous versions in which the at least one dopant layer is made of semiconductor material that is the same as the semiconductor material layer of the absorber layer, as well as heterologous versions with different semiconductor materials. From the standpoint of material technology, the absorber layer can preferably be made of crystalline silicon (c-Si) or of poly-crystalline silicon (poly-Si), the emitter layer or dopant layers can be made of hydrogen-enriched amorphous silicon (a-Si:H) or of poly-crystalline silicon (poly-Si), the field-passivation layers can be made of hydrogen-enriched amorphous silicon (a-Si:H), the buffer layers can be made of intrinsic amorphous silicon (i-a-Si), the insulating layer can be made of resin or silicon oxide, the conductive layer can be made of transparent, conductive oxide (TCO) or molybdenum, the surface-passivation layer, the reflective layer and the antireflective layer can be made of silicon nitride (SiN), the superstrate or substrate can be made of glass and the contact systems can be made of aluminum or of transparent, conductive oxide (TCO).

In a preferred method for the production of the above-mentioned thin-film solar module that is contacted on one side according to the invention in its various embodiments, the first contact system with its contacts and its outer contact layer can be produced by generating structuring in the thin-film packet all the way to the dopant or functional layer that is to be contacted, by means of drilling, etching or laser ablation, electrically insulating the structuring by allowing liquid insulating material to flow in, and unstructured metal-plating of the surface of the thin-film packet and of the structures over the entire surface area.

In this context, the flowable insulating material can be resin. Furthermore, an unstructured deposition of an additional functional layer can be carried out over the entire surface area prior to the metal-plating. As an alternative, the contacts of the first contact system and/or the electric series contacts for the series interconnection of the solar cell areas can also be generated by laser burning.

FIGS. 1A (cross sectional view), 1B (plan view with sectional indication) show the only one-sided (back) module interconnection concept that has been technically implemented in thin-film technology ("double-point concept")

until now. A first back contact system 100 and a second back contact system 200 have both point contacts 300, 400 for contacting an emitter layer 500 and a field-passivation layer 600 on both sides of an absorber layer 700 on a superstrate 770. The point contacts 300, 400 are oriented with respect to each other and connected to each other by means of narrow contact strips 800 so as to be electrically conductive in such a way that this results in a series interconnection of the strip-like solar cell areas 900. For the rest, the two contact systems 100, 200 are electrically insulated with respect to each other by means of an insulating layer 990.

All of the FIGS. 2-8 according to embodiments of the present invention show superstrate configurations in which the incident light passes through the superstrate as the carrier layer. The substrate configurations, however, are identical to the shown superstrate configurations in terms of their thin-film packet structure. In the case of substrate configurations, the light enters the thin-film packet through the two contact systems and no longer through the carrier layer. Consequently, both contact systems as well as the insulating layer have to be configured so as to be transparent. Both contact systems can be made, for example, of transparent conductive oxide (TCO) while the insulating layer can be made, for instance, of transparent silicon oxide ($SiO_2$) or silicon nitride (SiN) rather than resin. In exchange, however, the insulating passivation layer or the conductive layer no longer has to be necessarily configured so as to be transparent as is required with the superstrate configuration. Thus, the conductive layer in the substrate configuration can be made, for example, of metal instead of conductive oxide.

Furthermore, FIGS. 2 to 8 show p-n configurations. However, all of the embodiments shown can also be correspondingly configured as pin configurations since the contacting scheme towards the outside is identical. In each case, only other functional layers in the thin-film packet are contacted by the first and second contact systems. The depicted emitter and field-passivation layers in p-n configurations correspond to the dopant layers that collect the charge carriers (n-type electrons, p-type holes) in pin configurations, and the absorber layer is then not strongly doped but rather, it is undoped (intrinsic) or only weakly doped. All of the dopant layers, for example, as a single layer, can consist of doped a-Si:H, or else, as a double layer, of intrinsic and doped a-Si:H. The intrinsic layer then fulfills the function of a buffer layer (not shown). The reference numerals not shown or described in the figures that follow can be gleaned from the preceding figures and descriptions.

Figure 2:
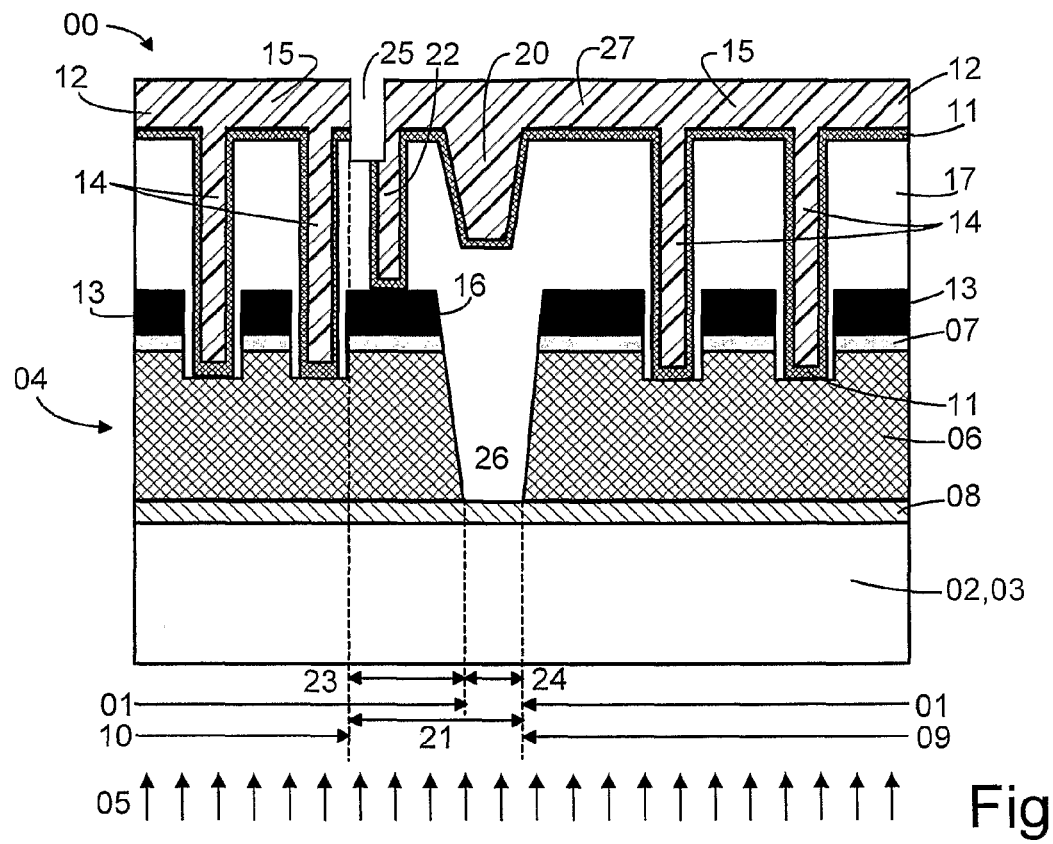
FIG. 2 shows a thin-film solar module according to an embodiment of the present invention with a back emitter layer and a field-passivation layer.

FIG. 2 shows a series connected thin-film solar module 00 consisting of strip-like solar cell areas 01 in a p-n configuration. A carrier layer 02 is configured as a superstrate 03 that is located above a thin-film packet 04. The incident light 05 enters through the superstrate 03. The figure shows an absorber layer 06 adjacent to which there is an emitter layer 07. It can be configured as a single or a double layer (see above). With respect to the incident light 05, the emitter 07 is arranged on the back of the absorber layer 06. On the front, that is to say, between the absorber layer 06 and the superstrate 03, there is an electrically insulating, transparent surface-passivation layer 08 consisting, for example, of SiN, which is optional. Moreover, an electrically conductive field-passivation layer 11 (back BSF) is provided. This layer, in turn, can be configured as a single or a double layer (see above). The field-passivation layer 11, however, is likewise optional.

FIG. 2 shows a first contact system 12 and a second contact system 13 which are both arranged on the back of the thin-film solar module 00 (relative to the incident light 05) and which thus do not have to be configured so as to be transparent. The first contact system 12 consists of mostly punctiform or linear contacts 14 and an outer contact layer 15 that is configured so as to cover the entire surface or to be grid-like. The punctiform or linear contacts 14 make contact with the absorber layer 06 on the side facing away from the incident light 05 and are thus not configured as plated-through holes. The second contact system 14, in contrast, merely consists of a full-surface inner contact layer 16 that is structured accordingly in order to pass through the punctiform or linear contacts 14 of the first contact system 12. An insulating layer 17 is arranged between the first contact system 12 and the second contact system 13.

An interconnection area 21 defined by a series interconnection 20 of the solar cell areas 01 is shown in the thin-film solar module 00. Within this interconnection area 21, the outer contact layer 15 of the first contact system 12 that extends into the interconnection area 21 and that belongs to a solar cell area 09 that is adjacent on one side to the interconnection area 21 is connected so as to be electrically conductive by means of series contacts 22 to the inner contact layer 16 of the second contact system that extends into the interconnection area 21 and that belongs to a solar cell area 10 that is adjacent on one side to the interconnection area 21. Outside of the interconnection area 21, the two contact systems 12, 13 are electrically insulated from each other by means of an insulating layer 17. In the interconnection area 21, the series contacts 22 define a contact area 23. Next to it in the interconnection area 21, there is a dead zone 24 that is very small in the interconnection concept according to the invention. Moreover, an insulating trench 25 that serves to interrupt the outer contact layer 15 of the first contact system 12 and that thus serves to electrically insulate the adjacent solar cell areas 09, 10 is provided inside the interconnection area 21. The thin-film packet 04 is divided into the strip-like solar cell areas 01 by separating trenches 26.

Figure 3:
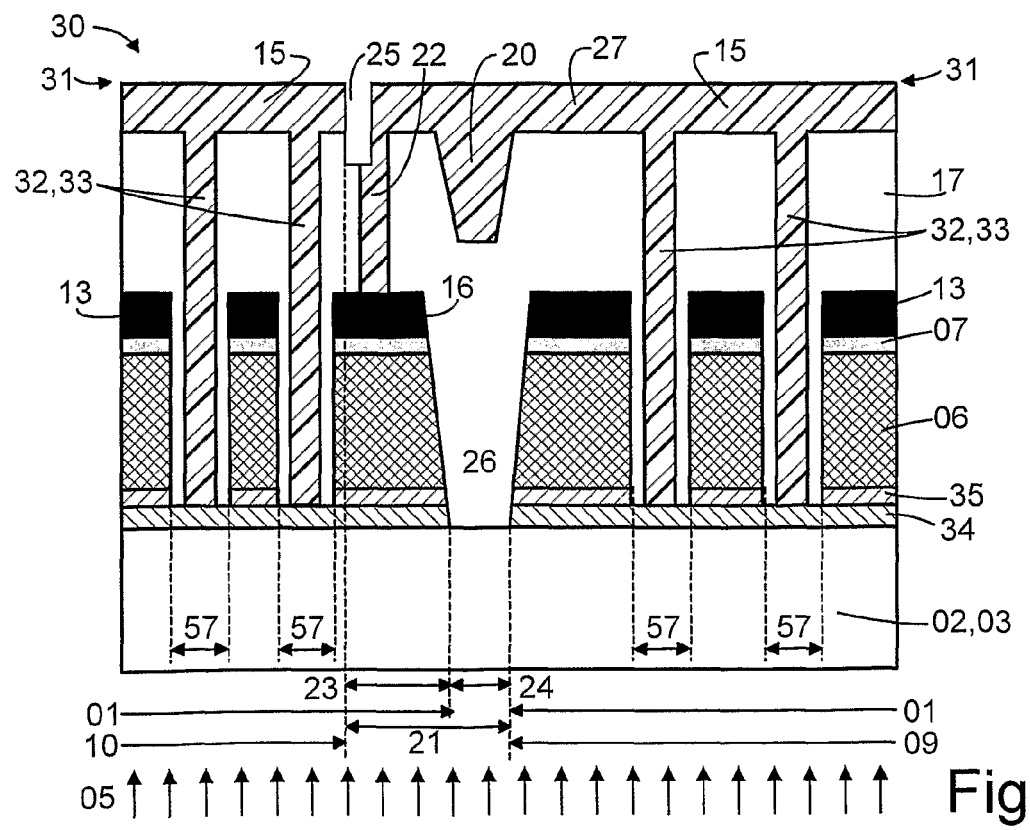
FIG. 3 shows a thin-film solar module according to an embodiment of the present invention with a back emitter layer and a conductive layer.

FIG. 3 shows a configuration of a thin-film solar module 30 with a first contact system 31 whose contacts 32 are configured as plated-through holes 33 that pass all the way through the absorber layer 06. The plated-through holes 33 in the embodiment shown contact a transparent conductive layer 34, for instance, TCO. Between the absorber layer 06 and the superstrate 03, there is a structured transparent conductive field-passivation layer 35 (FSF). Due to the plated-through holes 33, additional dead zones 57 are still created in the photoactive absorber layer 06 in addition to the dead zone 24 in the interconnection area 21.

Figure 4:
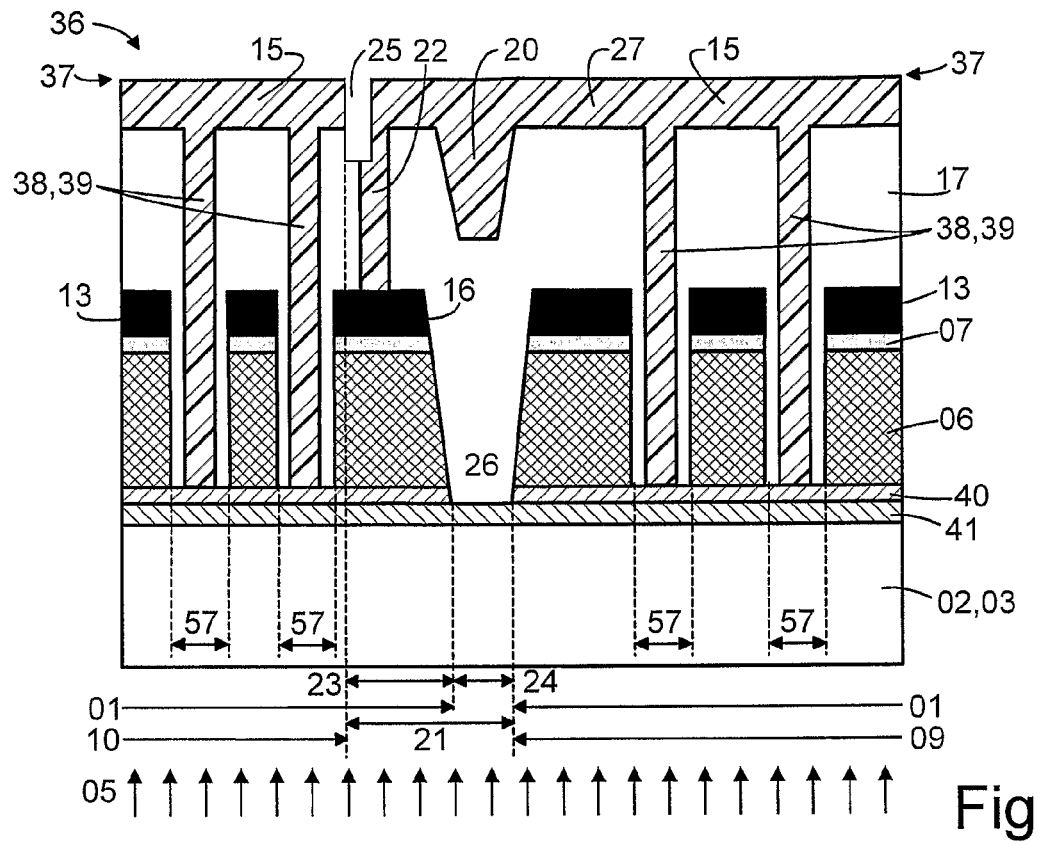
FIG. 4 shows a thin-film solar module according to an embodiment of the present invention with a back emitter layer and without a conductive layer.

FIG. 4 shows a configuration of a thin-film solar module 36 with a first contact system 37 whose contacts 38 are configured as plated-through holes 39 through the absorber layer 06 and contact an unstructured transparent conductive field-passivation layer 40 (FSF). There is an insulating transparent surface-passivation layer 41 between the absorber layer 06 and the superstrate 03. This is optional since the field-passivation layer 40 is already present. Due to the plated-through holes 39, additional dead zones 57 are still created in the photoactive absorber layer 06 in addition to the dead zone 24 in the interconnection area 21.

Figure 5:
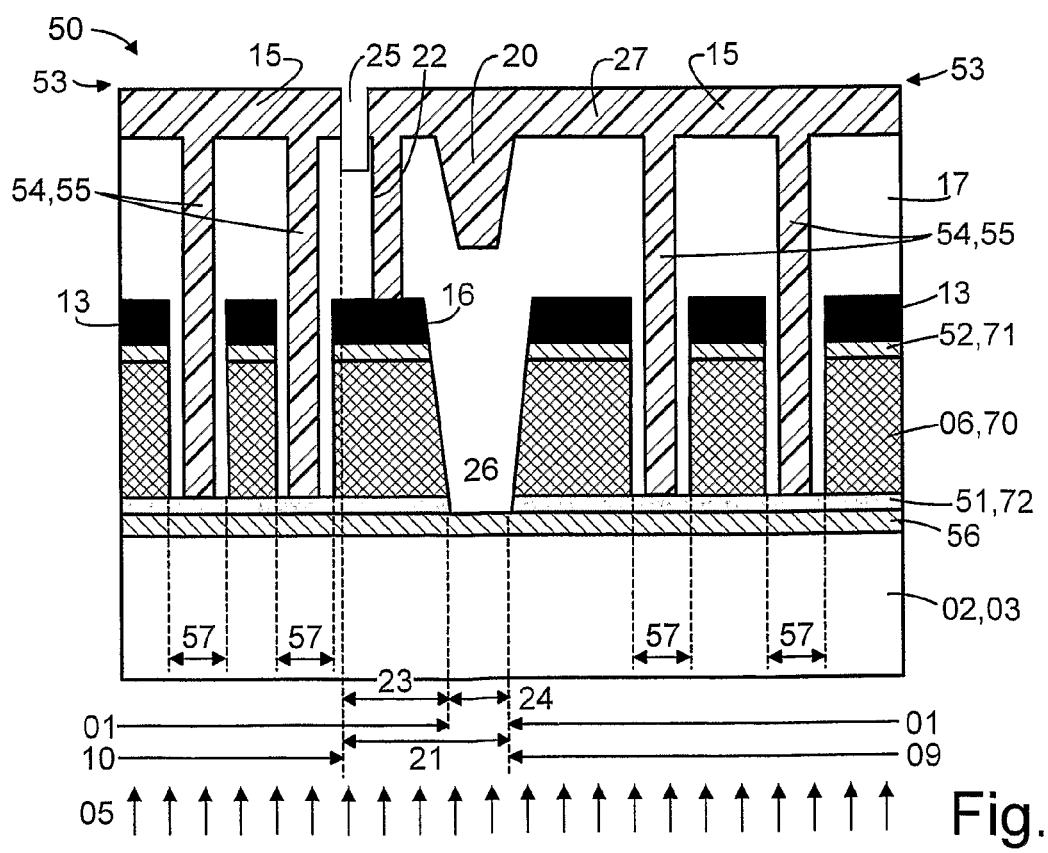
FIG. 5 shows a thin-film solar module according to an embodiment of the present invention with a front emitter layer and without a conductive layer.

FIG. 5 shows a thin-film solar module 50 in which an unstructured emitter layer 51 is arranged on the front of the absorber layer 06 with respect to the incident light. On the back of the absorber layer 06, there is a structured field-passivation layer 52 (BSF). The first contact system 53 has contacts 54 that, as plated-through holes 55, make contact with the unstructured emitter layer 51. Below the unstructured emitter layer 51, there is an electrically insulating transparent surface-passivation layer 56 which, however, is optional. When the emitter layer 51 is arranged on the front of the absorber layer 51 with respect to the incident light 05, however, additional dead zones 57 are still created in the photoactive absorber layer 06 in addition to the dead zone 24 in the interconnection area 21.

Figure 6:
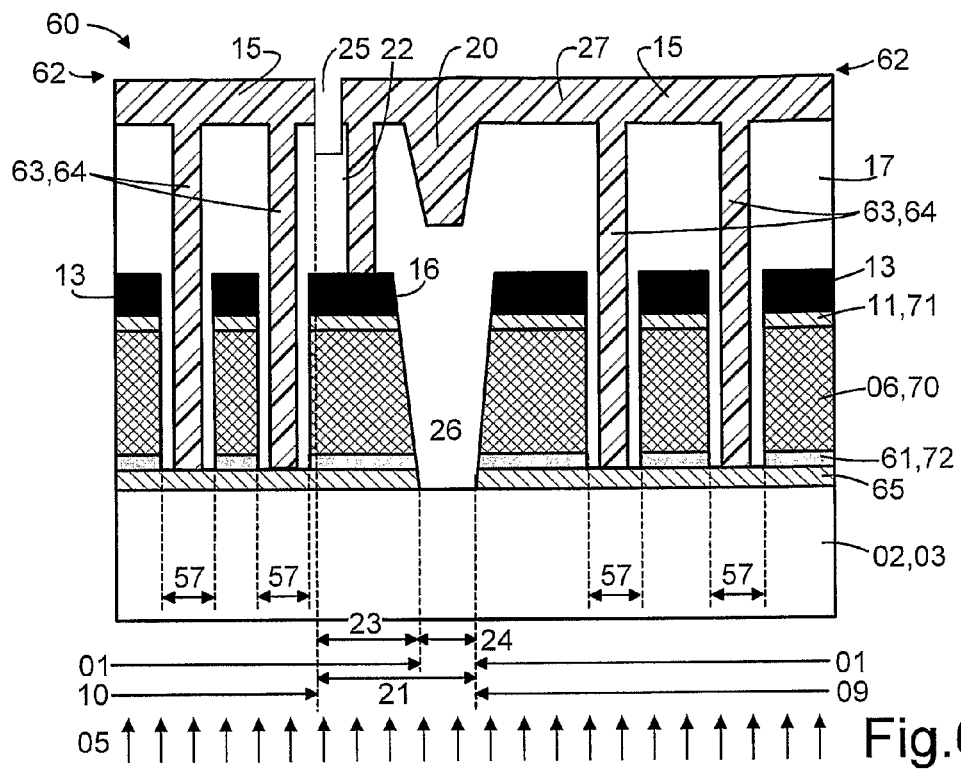
FIG. 6 shows a thin-film solar module according to an embodiment of the present invention with a front emitter layer and a conductive layer.

FIG. 6 shows a thin-film solar module 60 with a structured emitter layer 61 on the front of the absorber layer 06. The first contact system 62 has contacts 63 in the form of plated-through holes 64 that contact an unstructured transparent conductive layer 65 (TCO).

FIGS. 2 to 6 depict p-n configurations with an absorber layer 06 and an emitter layer 07, 51, 61. A pin configuration makes use of an intrinsic or weakly doped absorber layer 70 between two dopant layers 71, 72 with opposite doping. These layers correspond to the emitter layer and the field-passivation layer on both sides of the absorber layer 06, depending on the doping. The pin configuration is indicated by the designation of the applicable layers with the reference numerals 70, 71 and 72, for example, in FIGS. 5 and 6.

Figures 7A, 7B:
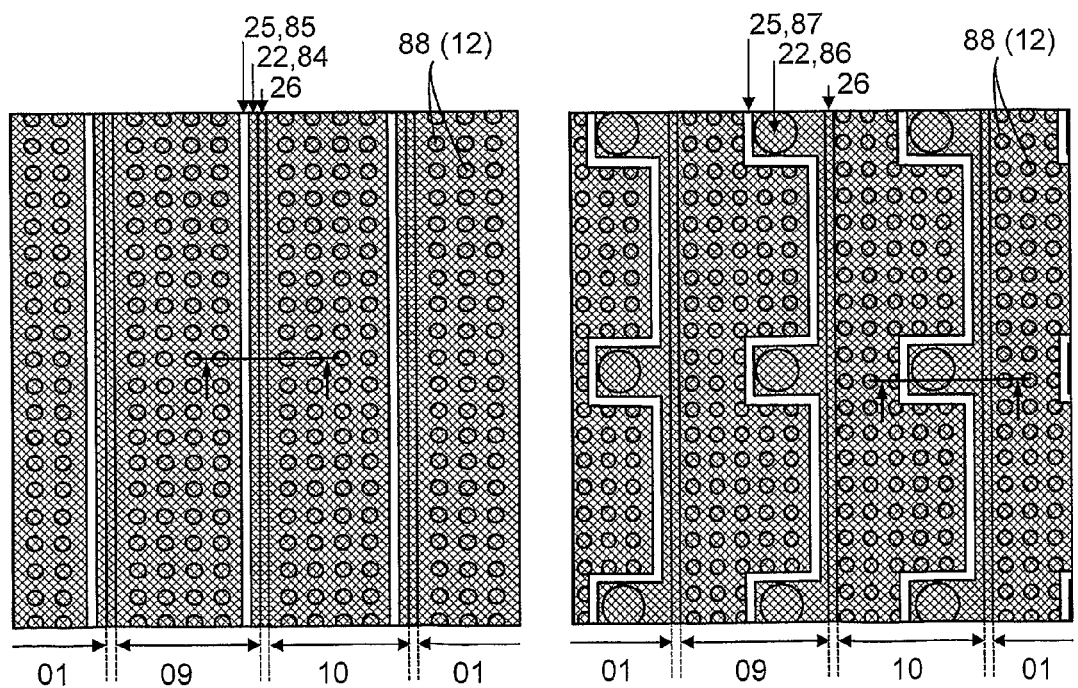
FIG. 7A is a plan view of a thin-film solar module according to an embodiment of the present invention with linear series contacts.
FIG. 7B is a plan view of a thin-film solar module according to an embodiment of the present invention with punctiform series contacts.

FIGS. 7A and 7B show two possible plan views of thin-film solar modules 00 according to the invention (the sectional lines for the cross sectional views are drawn in FIGS. 2 to 6). FIG. 7A shows the series contacts 22 with the linear series contacts 84 for the series interconnection of the two contact systems 12, 13 of adjacent solar cell areas 09, 10. The version with the linear insulating trenches 85 results in insulating trenches 25. FIG. 7B shows the series contacts 22 in the version with the punctiform series contacts 86 for the series interconnection of the two contact systems of adjacent solar cell areas 09, 10. The version with the meandering insulating trenches 87 results in insulating trenches 25. Adjacent to each of these, the linear separating trenches 26 between the solar cell areas 09, 10 are indicated. The contacts 14 of the first contact system 12 in the version with the punctiform series contacts 88 are also indicated. Particularly in the embodiment according to FIG. 7A with linear series contacts 84, the contacts can also be configured as linear contacts. These cited embodiments are each identical for all transitions between the solar cell areas 01, and they apply to all other embodiments of thin-film solar modules according to the invention. FIGS. 8A to 8J illustrate the production of a thin-film solar module 00 with strip-like solar cells 01 according to FIG. 2, including an integrated module interconnection.

(FIG. 8A) Preparation of a Thin-Film Packet 04

Deposition of the thin-film packet 04: superstrate 03 (e.g. glass)/(optional) passivation layer 08 (e.g. 80 nm SiN)/optional antireflection layer (not shown)/optional field-passivation layer (BSF, not shown)/optional conductive layer (not shown)/absorber layer 06 (e.g. recrystallized poly-Si that was generated by tempering amorphously deposited 2-µm a-Si:H)/emitter layer 07 (e.g. PECVD-deposited 30-nm a-Si:H)/metallic inner contact layer 16 of the second contact system 13 (e.g. 500-µm electron-beam vaporized Al).

(FIG. 8B) Module Structuring

Module structuring of the thin-film packet 04 in individual solar cell areas 09, 10 (here strips), generation of separating trenches 26, for example, by means of mechanical scratching or laser scribing.

(FIG. 8C) Application of the Insulating Layer 17 (Electric Insulation of the Second Contact System 13)

An insulating layer 17 is deposited onto the inner contact layer 16 of the second contact system 13. This is done either over the entire surface (for instance, by means of the PECVD deposition of $SiO_2$) and subsequent structuring, or already by means of structured application (for example, silk-screening, inkjet printing, for example, of an organic resin (cast resin) or of insulating pastes).

(FIG. 8D) Point-Structuring of Insulating Layer 17

The insulating layer 17 arranged on the back is now punctiformly structured. That is to say, structures 75 (for instance, holes with a diameter of 100 µm) are created in the insulating layer 17 at regular intervals. The structuring is done either already when the insulating layer 17 itself is being applied (for example, by means of silk-screening or inkjet printing of the insulating layer 17) or by means of inkjet printing of an etching solution or by means of silk-screening or inkjet printing of a masking layer followed by an etching procedure.

(FIG. 8E) Punctiform Exposure of the Absorber Layer 06

The punctiformly structured insulating layer 17 now serves as a masking layer in order to expose the back of the absorber layer 06 by means of an etching solution. Both the inner contact layer 16 of the second contact system 13 and the emitter layer 07 are removed punctiformly. Optionally, if a field-passivation layer (BSF) is present, the absorber layer can also be removed punctiformly, and this then results in plated-through holes.

As an alternative to this, an insulating layer 17 that has been applied over the entire surface area can also be exposed by means of stepwise laser structuring all the way to the back of the absorber layer 06 (stepwise laser drilling of structures 75 through the insulating layer 17, the contact layer 16 of the second contact system 13 and the emitter layer 07).

(FIG. 8F) Inner Insulation of the Structures 75

The insides of the created structures 75 are covered with an insulating lining 76. This is easiest to accomplish by means of brief tempering using an organic cast resin (resin) as the insulating lining. The insulating lining 24 (resin) then liquefies and flows down the structures 75. As an alternative, another insulating layer can be applied over the entire surface of the insulating layer 17 arranged on the back (this layer then covers the insulating layer 17, the walls and the floors of the structures 75), and the floors are then exposed (etching) by means of a masking layer applied by means of silk-screening or inkjet printing. The material of the insulating layer 17 and of the insulating lining 76 can be the same.

(FIG. 8G) Exposure of Contacting Openings 77 for the Subsequent Series Contacts 22 of the Series Interconnections Linear contact openings 77 (which can also be punctiform, see FIG. 7B) leading to the contact layer 16 (13) of the second contact system 13 (here contacting of the emitter layer 07) for the series contacts 22 of the series interconnections of the thin-film layer 00 are exposed on the insulating layer 17, analogously to the process steps according to FIG. 5d. As an alternative, it is possible to dispense with the exposure procedure and to create the series contacts 22 between the first contact system 12 and the second contact system 13 in order to establish the series connection between the adjacent solar cell areas 09, 10 later by means of laser-burned contacting.

(FIG. 8H) Optional, Full-Surface, Unstructured Deposition of a Field-Passivation Layer Optionally, a field-passivation layer 11 (e.g. PECVD-deposited 30-nm a-Si:H) is deposited onto the now structured insulating layer 17 arranged on the back. This layer thus covers the insulating layer 17 as well as the exposed floors of the hole of the back of the absorber layer 12, thus forming contacts 14 (here punctiform, analogously also linear) to the back of the absorber.

(FIG. 8I) Unstructured, Full-Surface Deposition of the First Contact System

The metallic outer contact layer 15 of the first contact system 12 (e.g. electron-beam-evaporated Al or silk-screened/ink-jet printed metallic pastes) is deposited onto the optionally deposited field-passivation 11 or onto the structured insulating layer 17 arranged on the back. Therefore, the contact layer 15 covers the field-passivation layer 11 or the insulating layer 17. In the area of the previously created structures, this automatically forms the contacts 14 and the series contacts 22, without the need for separate, complex structuring steps. The filling of the separating trench 26 shown in the insulating layer 17 does not have a function here.

(FIG. 8J) Separation of the Outer Contact Layer of the First Contact System

In order to realize the series interconnection of the solar cell areas 09, 10, the insulating trenches 25 are subsequently removed again from the outer contact layer 15 and from the optionally deposited field-passivation layer 11 by means of laser ablation or by means of a masking procedure followed by etching.

As an alternative, the metallic outer contact layer 15 can be deposited so as to be structured right away (for example, by means of silk-screened or ink jet printed metallic pastes), so that the contacts 14 make contact with layer sections 27 that are deposited in such a way that they are structured over the entire surface (strip-like or grid-like) so that they contact all of the contacts belonging to one solar cell area 09, 10, and in each case, one grid web of one solar cell area 10 collects the series contacts 22 of the adjacent solar cell area 09. If the process step according to FIG. 8G was left out, then it is subsequently necessary to establish the electrically conductive connection of the second contact system 12 to the first contact system 13, for instance, by means of laser-burned contacting.

The module interconnection having a thin-film packet with a pin structure is produced analogously, whereby an intrinsic or weakly doped absorber layer and two oppositely doped dopant layers are worked into the thin-film packet. All of the coating and structuring steps are carried out in the same manner as in the above-mentioned elaborations. The structure of the thin-film packet does not have any influence on the basic structure of the module interconnection to the two contacting systems which only contact correspondingly different layers.

Figure 8A:
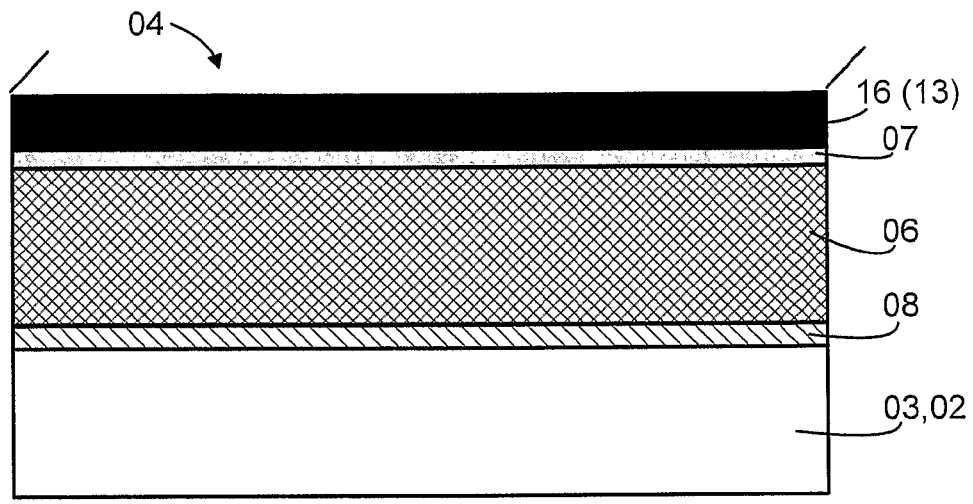
FIGS. 8A-J illustrate the production of a thin-film solar module according to the embodiment of FIG. 2.
Figure 8B:
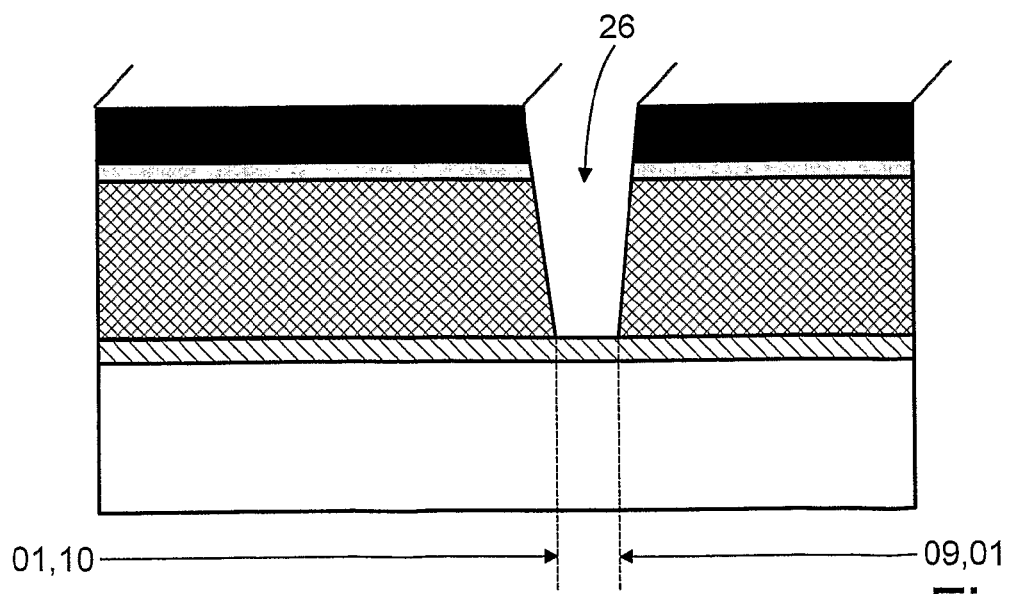
Figure 8C:
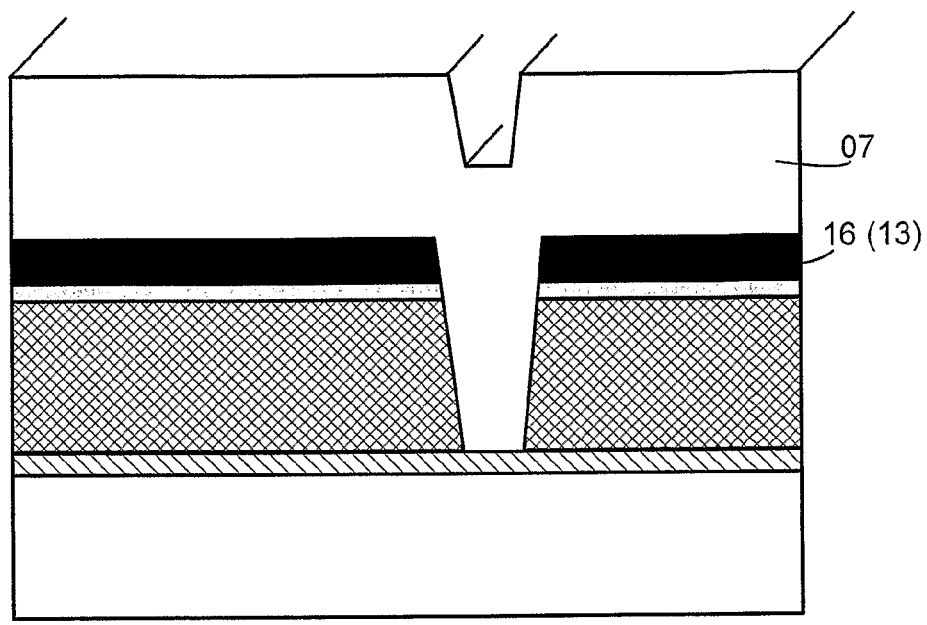
Figure 8D:
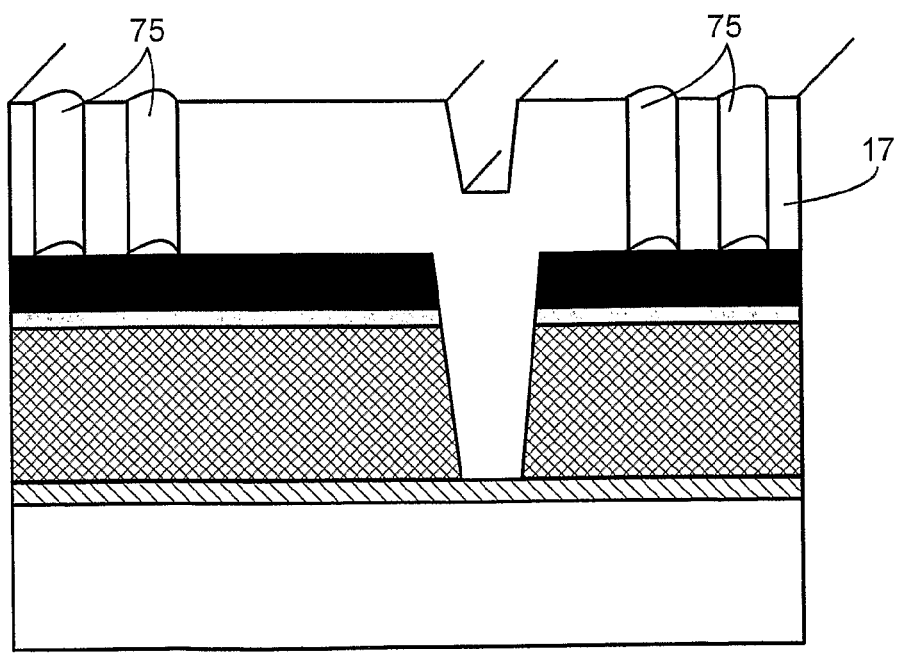
Figure 8E:
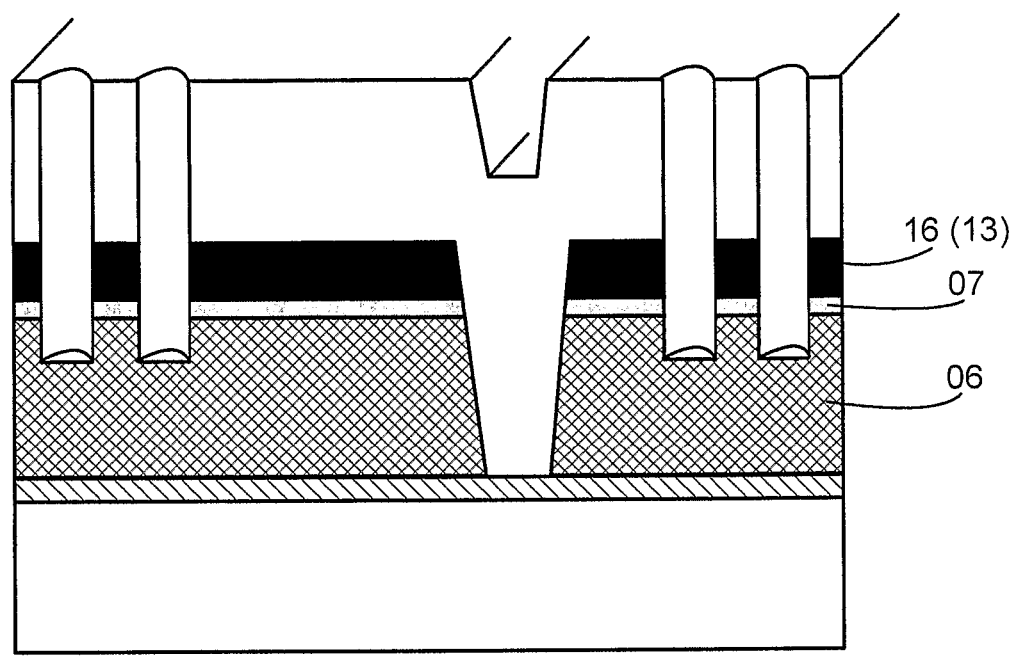
Figure 8F:
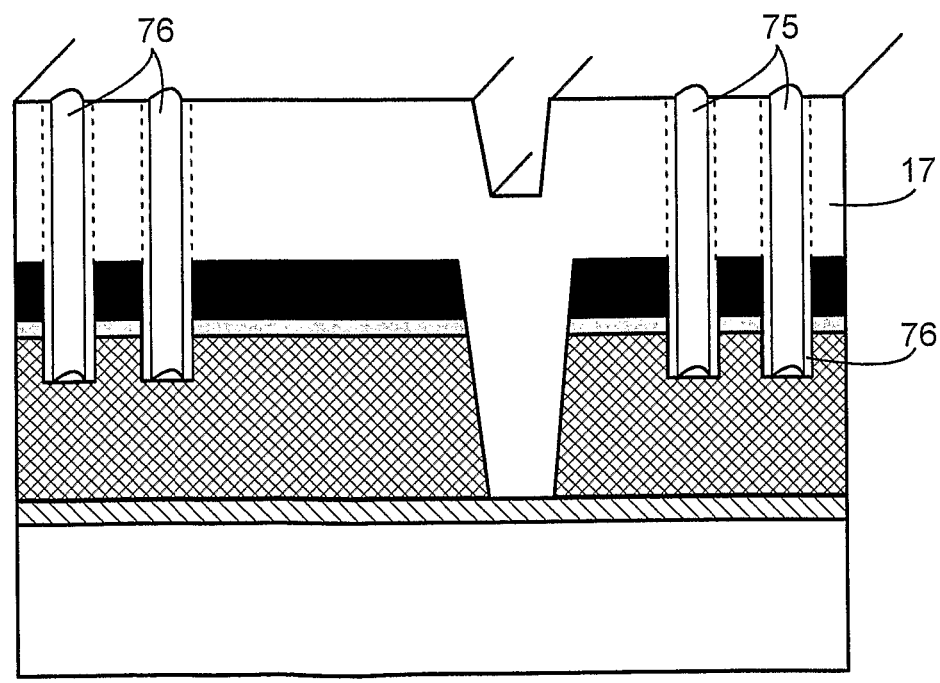
Figure 8G:
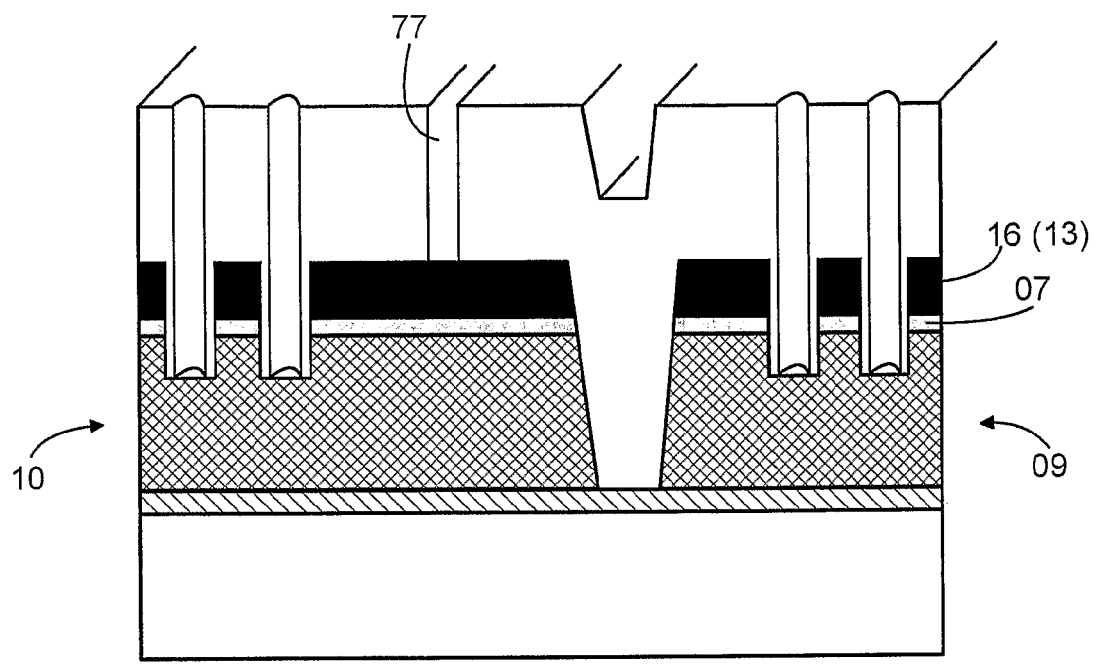
Figure 8H:
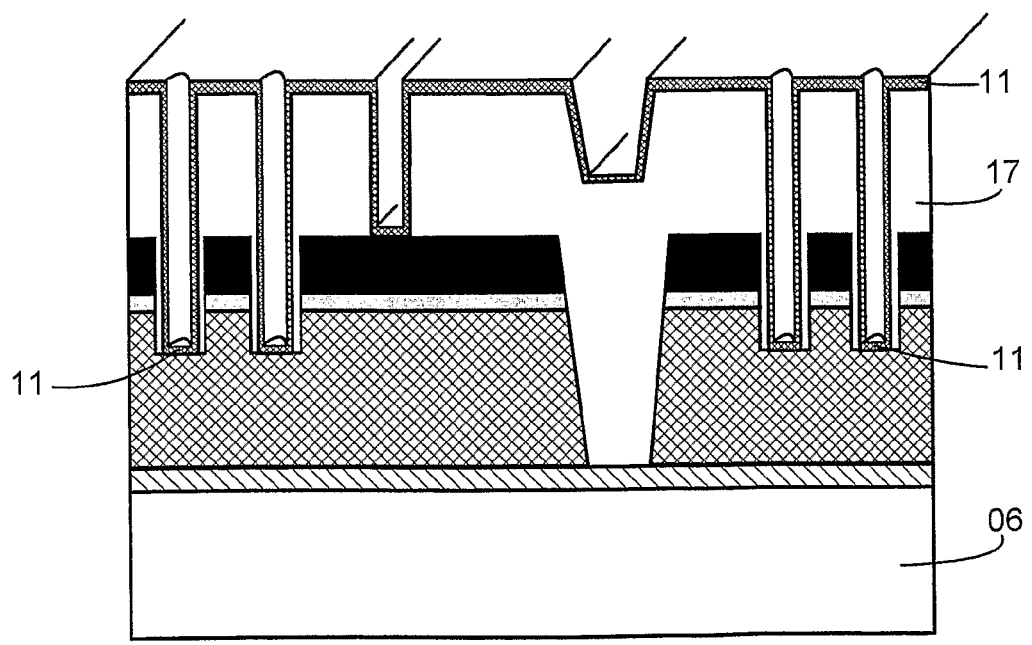
Figure 8I:
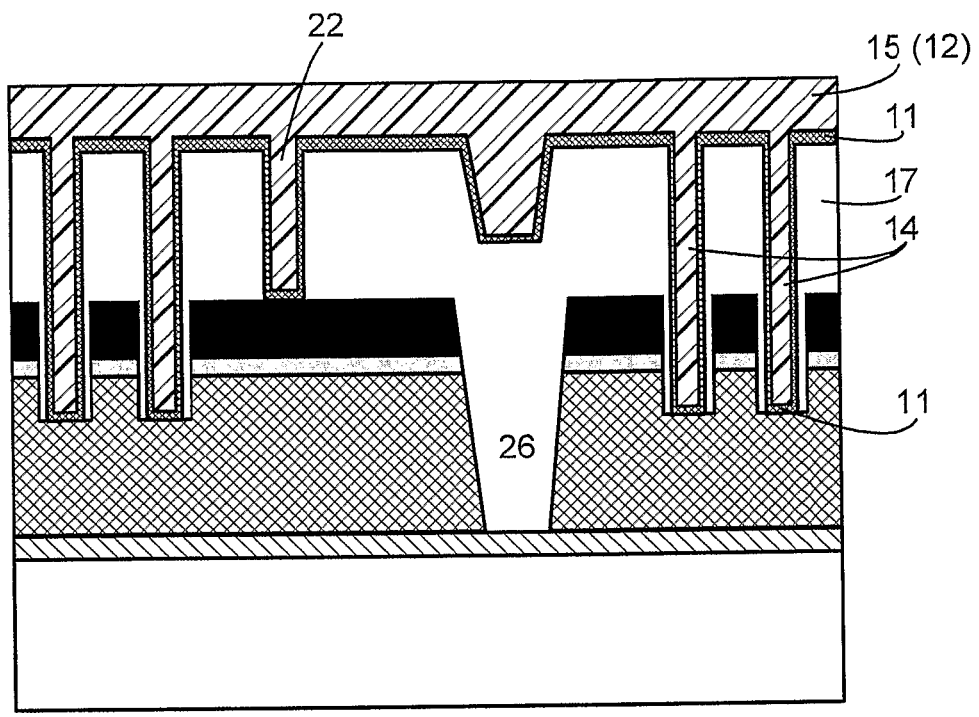
Figure 8J:
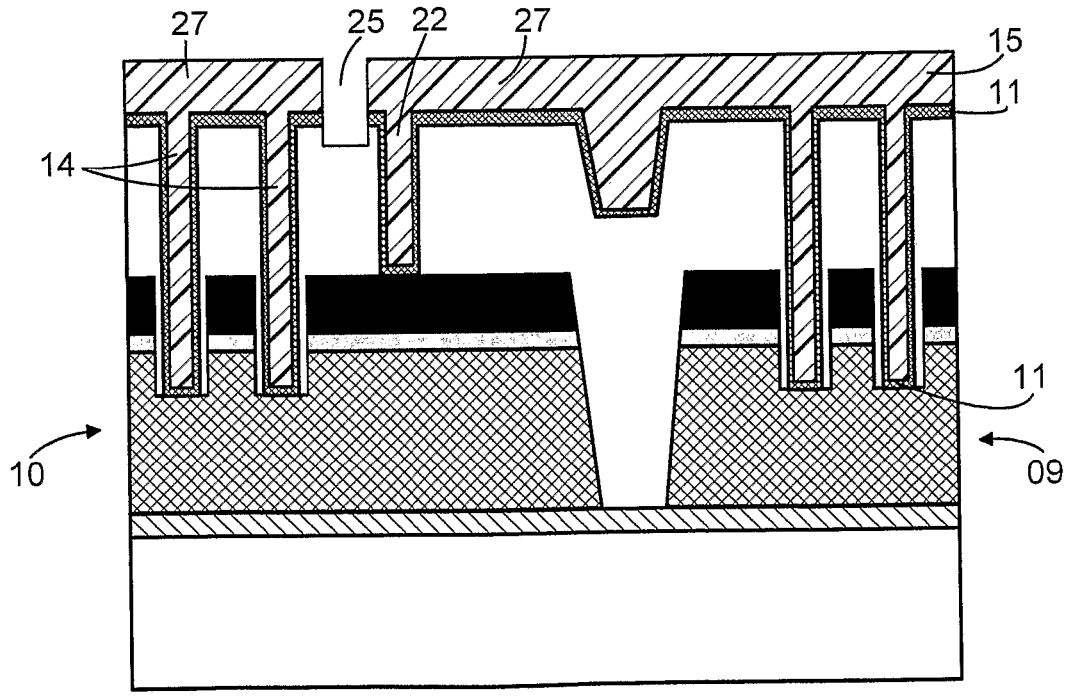

In comparison to the one-sided full-surface/punctiform series module interconnection according to an embodiment of the invention as shown in FIG. 8J having a conventional, two-side full-surface series module interconnection, in which almost the entire interconnection area is at the same time a dead zone, the result is that, with the embodiment of the invention, the dead zone is substantially smaller. This translates into a higher module efficiency related to the surface area in the case of the invention, as compared to the conventional two-sided series interconnections of the thin-film solar modules.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS 100 first contact system
200 second contact system
300 point contact
400 point contact
500 emitter layer
600 field-passivation layer
700 absorber layer
770 superstrate
800 contact strips
900 solar cell area
990 insulating layer
00 series interconnected thin-film solar module
01 solar cell area
02 support layer
03 superstrate
04 thin-film package
05 incident light
06 absorber layer
07 emitter layer
08 surface-passivation layer (functional layer)
09 solar cell area (adjacent)
10 solar cell area (adjacent)
11 field-passivation layer (functional layer)
12 first contact system
13 second contact system
14 contacts (12)
15 outer contact layer (12)
16 inner contact layer (13)
17 insulating layer
20 series interconnection
21 interconnection area
22 series contact
23 contact area
24 dead zone
25 insulating trench
26 separating trench
27 contact layer sections
30 thin-film solar module
31 first contact system
32 contacts 31
33 plated-through hole (32)
34 conductive layer
35 field-passivation layer (functional layer)
36 thin-film solar module
37 first contact system
38 contacts (37)
39 plated-through hole (38)
40 field-passivation layer (functional layer)
41 surface-passivation layer (functional layer)
50 thin-film solar module
51 emitter layer
52 field-passivation layer (functional layer)
54 contacts (53)
55 plated-through hole (54)
56 surface-passivation layer (functional layer)
57 additional dead zone
60 thin-film solar module
61 emitter layer
62 first contact system
63 contacts (62)
64 plated-through hole (63)
65 conductive layer (functional layer)
70 intrinsic or weakly doped absorber layer
71 dopant layer (p-type or n-type, opposite to 72)
72 dopant layer (n-type or p-type, opposite to 71)
75 structuring
76 insulating lining
77 contacting opening
84 linear series contact (22)
85 linear series contact (25)
86 punctiform series contact (22)
87 meandering insulating trench (25)
88 punctiform contact (14)

The invention claimed is:

1. A thin-film solar module contacted on one side comprising:
   a support layer;
   a photoactive absorber layer on the support layer;
   at least one dopant layer deposited over a surface area of at least one side of the absorber layer so as to form a thin-film packet that is divided into thin-film solar cell areas by insulating separating trenches;
   a first contact system including contacts connected by an outer contact layer;
   a second contact system consisting of an inner contact layer completely covering a side of the solar cell areas that face away from the support layer so as to separately discharge excess charge carriers generated by incident light in the absorber layer, the second contact system including structures that surround and electrically insulate the contacts, the contacts extending through the inner contact layer from the outer contact layer,
   wherein the first and second contact systems are located on a same side of the photovoltaic absorber layer and are electrically conductive and connected in series by series contacts in interconnection areas and electrically insulated from each other by an insulation layer outside of the interconnection areas.

2. The thin-film solar module according to claim 1, wherein the series contacts are configured as linear contacts and the first contact system further comprises linear insulating trenches disposed in the outer contact layer in the interconnection areas.

3. The thin-film solar module according to claim 1, wherein the series contacts are configured as punctiform contacts and the first contact system further comprises insulating trenches disposed in the outer contact layer in the interconnection areas.

4. The thin-film solar module according to claim 1, wherein the contacts of the first contact system and the structures of the inner contact layer of the second contact system are configured as at least one of punctiform and linear.

5. The thin-film solar module according to claim 1, further comprising:
   a carrier layer configured as a superstrate of the thin-film solar module.

6. The thin-film solar module according to claim 1, wherein the thin-film solar module has a p-n configuration in which the absorber layer is doped and the at least one dopant layer includes at least one counter-doped emitter layer so as to separate the excess charge carriers generated in the absorber layer by the incident light.

7. The thin-film solar module according to claim 6, wherein at least one of the absorber layer and an associated functional layer of the absorber layer in contact with the inner contact layer of the second contact system via the contacts of the first contact system.

8. The thin-film solar module according to claim 6, wherein the at least one emitter layer is disposed on a side of the thin-film solar module facing away from the incident light.

9. The thin-film solar module according to claim 6, wherein the at least one emitter layer is disposed on a side of the thin-film solar module facing the incident light.

10. The thin-film solar module according to claim 1, wherein the thin-film solar module has a p-i-n configuration in which the absorber layer is at least one of intrinsic and weakly doped, and the at least one dopant layer includes at least two dopant layers having opposite doping on both sides of the absorber layer.

11. The thin-film solar module according to claim 10, wherein one of the at least two dopant layers is in contact with the inner contact layer of the second contact system via the contacts of the first contact system.

12. The thin-film solar module according to claim 1, further comprising:
    functional layers, including at least one of the group consisting of: an antireflective layer, a seed layer, a surface-passivation layer, a field-passivation layer, a conductive layer and a buffer layer.

13. The thin-film solar module according to claim 1, wherein the at least one dopant layer includes a semiconductor material that is the same as a semiconductor material of the absorber layer.

14. The thin-film solar module according to claim 1, wherein the at least one dopant layer includes a semiconductor material that is different than a semiconductor material of the absorber layer.

15. The thin-film solar module according to claim 1, further comprising:
    functional layers, including field-passivation layers, buffer layers, a conductive layer, a surface-passivation layer, a reflective layer and an antireflective layer;
    wherein the absorber layer includes at least one of crystalline silicon and poly-crystalline silicon;
    wherein the at least one dopant layers includes at least one of hydrogen-enriched amorphous silicon and poly-crystalline silicon;
    wherein the field-passivation layers include hydrogen-enriched amorphous silicon;
    wherein the buffer layers include intrinsic amorphous silicon;
    wherein the insulating layer includes at least one of a resin and silicon oxide;
    wherein the conductive layer includes at least one of transparent, conductive oxide and molybdenum;
    wherein the surface-passivation layer, the reflective layer and the antireflective layer each include silicon nitride, at least one of a superstrate and a substrate of the thin-film solar module including glass; and
    wherein the first and second contact systems include at least one of aluminum and transparent, conductive oxide.

16. A method for the production of a thin-film solar module contacted on one side and having a first contact system including contacts connected by an outer contact layer and a second contact system consisting of an inner contact layer disposed below the outer contact layer, the method comprising:
    generating, by at least one of drilling, etching and laser ablation, a first set of structures in a thin-film packet formed by a support layer, a photoactive absorber layer, a dopant layer deposited over a surface area on a side of the absorber layer, and the inner contact layer of the second contact system, wherein the structures extend through the inner contact layer of the second contact system, the dopant layer, and at least part of the absorber layer;
    electrically insulating the first set of structures by providing liquid insulating material into the structures;
    generating a second set of structures in the insulating material that extend through the insulating material, the inner contact layer of the second contact system, the dopant layer, and at least part of the absorber layer;

electrically insulating the second set of structures;
exposing contact openings within the insulating material to expose the inner contact layer of the second contact system; and
performing an unstructured metal-plating of a surface of the thin-film packet and of a surface of the second set of structures and the contact opening to form the first contact system.

17. The method according to claim 16, further comprising:
prior to the step of performing the unstructured metal-plating, performing an unstructured deposition of an additional functional layer over an entire surface area of the thin-film packet.

18. The method according to claim 16, further comprising:
generating, by laser burning, the contacts of the first contact system.

19. The method according to claim 16, further comprising:
generating, by laser burning, series contacts in interconnection areas such that the first and second contact systems are connected in series by the series contacts in the interconnection areas and electrically insulated from each other by an insulation layer outside of the interconnection areas.

20. A thin-film solar module contacted on one side, comprising:
a photoactive absorber layer;
a dopant layer deposited over a surface area on a side of the absorber layer;
insulating separating trenches, disposed in the dopant and absorber layers, dividing thin-film solar cell areas of the thin-film solar module from one another;
a first contact system including an outer contact layer and a plurality of contacts connected by the outer contact layer;
a second contact system including a full-surface inner contact layer inner contact layer having pass-through regions for the plurality of contacts of the first contact system; and
an interposed insulation layer, disposed between the first contact system and the second contact system, configured to electrically insulate the first contact system and the second contact system from one another outside of interconnection areas;
wherein the plurality of contacts of the first contact system extend from the outer contact layer of the first contact system through the inner contact layer of the second contact system from the outer contact layer;
wherein the first and second contact systems are both disposed on a back side of the thin-film solar module relative to incident light on the thin-film solar module;
wherein the first and second contact systems are connected in series by series contacts in interconnection areas.

* * * * *